US012648333B2

(12) United States Patent
Yu et al.

(10) Patent No.: US 12,648,333 B2
(45) Date of Patent: Jun. 2, 2026

(54) DISPLAY PANEL AND DISPLAY DEVICE

(71) Applicant: Wuhan China Star Optoelectronics Semiconductor Display Technology Co., Ltd., Wuhan (CN)

(72) Inventors: Shengrong Yu, Wuhan (CN); Yuan Yan, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 353 days.

(21) Appl. No.: 18/373,319

(22) Filed: Sep. 27, 2023

(65) Prior Publication Data

US 2024/0268185 A1 Aug. 8, 2024

(30) Foreign Application Priority Data

Feb. 6, 2023 (CN) .......................... 202310099854.9

(51) Int. Cl.
*H10K 59/65* (2023.01)
*H10K 59/122* (2023.01)
*H10K 59/80* (2023.01)

(52) U.S. Cl.
CPC ........... *H10K 59/65* (2023.02); *H10K 59/122* (2023.02); *H10K 59/8791* (2023.02)

(58) Field of Classification Search
None
See application file for complete search history.

(56) References Cited

U.S. PATENT DOCUMENTS 12,087,080 B2 9/2024 Wen et al.
12,414,389 B2 9/2025 Song et al.

2019/0056613 A1 2/2019 Wang et al.
2021/0151524 A1* 5/2021 Tang .................. G06V 40/1318
2022/0351540 A1 11/2022 Hai et al.

FOREIGN PATENT DOCUMENTS

| CN | 111785854 | 10/2020 |
| CN | 113327953 | 8/2021 |
| CN | 113644096 | 11/2021 |
| CN | 114122017 | 3/2022 |
| CN | 115312540 | 11/2022 |

OTHER PUBLICATIONS

Notification of Office Action and Search Report Dated Mar. 19, 2026 From The State Intellectual Property Office of the People's Republic of China Re. Application No. 202310099854.9 and Its Translation Into English. (15 Pages).

* cited by examiner

*Primary Examiner* — Anthony Ho

(57) ABSTRACT

The present application provides a display panel and a display device. The display panel includes pixel driving circuits provided respectively corresponding to pixel regions and a photosensitive device provided corresponding to a photosensitive region between the pixel regions, wherein the display panel further includes: a substrate; a first metal layer provided on a side of the substrate, a first semiconductor layer disposed on a side of the first metal layer away from the substrate, a second semiconductor layer disposed on a side of the first semiconductor layer away from the substrate, and a third semiconductor layer disposed on a side of the second semiconductor layer away from the substrate. The first metal layer includes a shield portion provided corresponding to the pixel region and a reflection portion provided corresponding to the photosensitive region.

20 Claims, 7 Drawing Sheets

DISPLAY PANEL AND DISPLAY DEVICE

CROSS-REFERENCE TO RELATED APPLICATIONS

This application claims the benefit of priority of Chinese Patent Application No. 202310099854.9, filed on Feb. 6, 2023, the contents of which are incorporated by reference as if fully set forth herein in their entirety.

TECHNICAL FIELD

The present application relates to a display field, and more particularly, to a display panel and a display device.

BACKGROUND

An in-screen optical fingerprint recognition technology has been applied to a display device for security and convenience. In the in-screen optical fingerprint recognition technology, a photosensitive diode is integrated in a display panel, and light reflected by a finger is identified by the photosensitive diode, thereby achieving a fingerprint recognition effect.

However, a portion of the light reflected by the finger may pass through the display panel and be not received by the photosensitive diode, so that an optical signal-to-noise ratio of the photosensitive diode is lesser, resulting in a reduction in the accuracy of in-screen optical fingerprint recognition.

SUMMARY

The present application provides a display panel and a display device to improve the optical signal-to-noise ratio of the photosensitive device and the accuracy of the in-screen optical fingerprint recognition.

To solve the above problems, an aspect of the present application provides a display panel including pixel driving circuits provided respectively corresponding to pixel regions and a photosensitive device provided corresponding to a photosensitive region between the pixel regions. The display panel further includes: a substrate; a first metal layer provided on a side of the substrate, including a shield portion provided corresponding to the pixel region and a reflection portion provided corresponding to the photosensitive region; a first semiconductor layer disposed on a side of the first metal layer away from the substrate, the first semiconductor layer including a first driving semiconductor portion disposed corresponding to the pixel region and a first light-transmitting semiconductor portion disposed corresponding to the photosensitive region, and the pixel driving circuit including the first driving semiconductor portion; a second semiconductor layer disposed on a side of the first semiconductor layer away from the substrate, the second semiconductor layer including a photosensitive semiconductor portion disposed corresponding to the photosensitive region; and a third semiconductor layer disposed on a side of the second semiconductor layer away from the substrate, the third semiconductor layer including a second light-transmitting semiconductor portion disposed corresponding to the photosensitive region, and the photosensitive device including the first light-transmitting semiconductor portion, the photosensitive semiconductor portion, and the second light-transmitting semiconductor portion stacked in sequence.

Another aspect of The present application also provides a display device including a display panel. the display panel including pixel driving circuits provided respectively corresponding to pixel regions and a photosensitive device provided corresponding to a photosensitive region between the pixel regions. The display panel further includes: a substrate; a first metal layer provided on a side of the substrate, the first metal layer including a shield portion provided corresponding to the pixel region and a reflection portion provided corresponding to the photosensitive region; a first semiconductor layer disposed on a side of the first metal layer away from the substrate, the first semiconductor layer including a first driving semiconductor portion disposed corresponding to the pixel region and a first light-transmitting semiconductor portion disposed corresponding to the photosensitive region, and the pixel driving circuit including the first driving semiconductor portion; a second semiconductor layer disposed on a side of the first semiconductor layer away from the substrate, the second semiconductor layer including a photosensitive semiconductor portion disposed corresponding to the photosensitive region; and a third semiconductor layer disposed on a side of the second semiconductor layer away from the substrate, the third semiconductor layer including a second light-transmitting semiconductor portion disposed corresponding to the photosensitive region. The photosensitive device includes the first light-transmitting semiconductor portion, the photosensitive semiconductor portion, and the second light-transmitting semiconductor portion stacked in sequence.

BRIEF DESCRIPTION OF THE DRAWINGS

Technical solutions and other beneficial effects of the present application will be apparent through a detailed description of the specific embodiments of the present application in conjunction with the accompanying drawings.

ILLUSTRATION OF REFERENCE SIGNS

Figure 1:
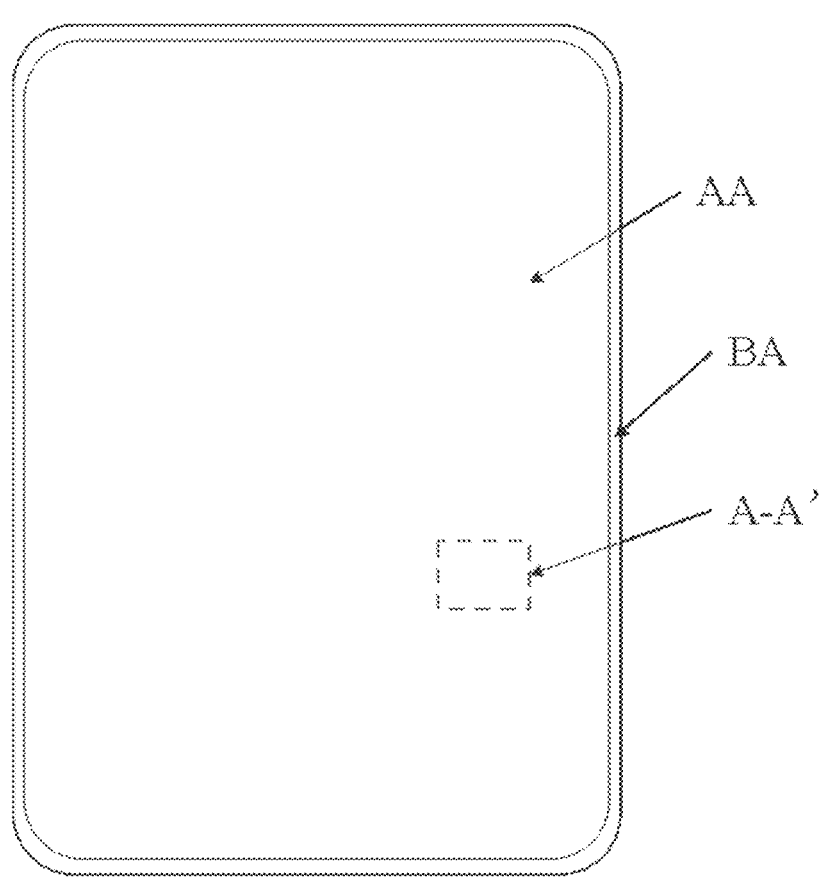
FIG. 1 is a schematic plan view of a display panel according to an embodiment of the present application.

BA Border region; AA Display Region; PA Pixel Region; SA Photosensitive Region; S Photosensitive Device; T1 First Transistor; T2 Second Transistor; C Storage Capacitor; 11 Substrate -continued 12 First Insulation Layer; 131 Shield Portion; 132 Reflection Portion
14 Second Insulation Layer; 151 First Light-Transmitting Semiconductor Portion
152 First Driving Semiconductor Portion; 161 Photosensitive Semiconductor Portion;
171 Second Light-Transmitting Semiconductor Portion; 18 Third Insulation Layer
191 First Capacitor Electrode; 192 First Gate Electrode; 20 Fourth Insulation Layer
212 Second Capacitor Electrode; 213 Second Gate Electrode; 211 Third Gate Electrode;
22 Fifth Insulation Layer; 231 Second Driving Semiconductor Portion;
24 Sixth Insulation Layer; 251 Transparent Electrode; 26 Seventh Insulation Layer;
271 First Source Electrode; 272 First Drain Electrode; 273 Second Source Electrode;
274 Second Drain Electrode; 275 First Photosensitive Electrode;
276 Second Photosensitive Electrode; 277 Shield Connection Electrode;
28 Eighth Insulation Layer; 291 First Electrode; 30 Ninth Insulation Layer;
311 Fourth Gate Electrode; 32 Tenth Insulation Layer; 331 Lap Electrode;
34 Pixel Definition Layer; 341 Pixel Opening; 342 First Through-Hole;
35 Light-Emitting Material Layer; 36 Encapsulation Layer; 37 Touch Control Layer;
371 Pixel Through-Hole; 372 Second Through-Hole; 38 Color Film Layer;
381 Black Color Resist Layer; 382 Filter Portion; 383 Filter Opening;
384 Third Through-Hole; 39 Cover Plate.

DETAILED DESCRIPTION

Technical solutions in implementations and/or embodiments of the present application will be clearly and completely described below in conjunction with presented implementations of the present application. Apparently, the implementations and/or embodiments described below are only portion of, not all of, the implementation of the present application. Based on the implementations and/or embodiments in the present application, all other implementations and/or embodiments obtained by those of ordinary skill in the art without creative efforts fall within the scope of the present application.

In the description of the present disclosure, it should be understood that orientations or position relationships indicated by the terms "center", "lateral", "upper", "lower", "left", "right", "vertical", "horizontal", "top", "bottom", "inside", "outside", or the like are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include one or more of the features.

In a current display device, the optical signal-to-noise ratio of the photosensitive diode is lesser and the accuracy of in-screen optical fingerprint recognition is reduced. To this end, an embodiment of the present application provides a display panel and a display device which may improve the above problems.

Figure 2:
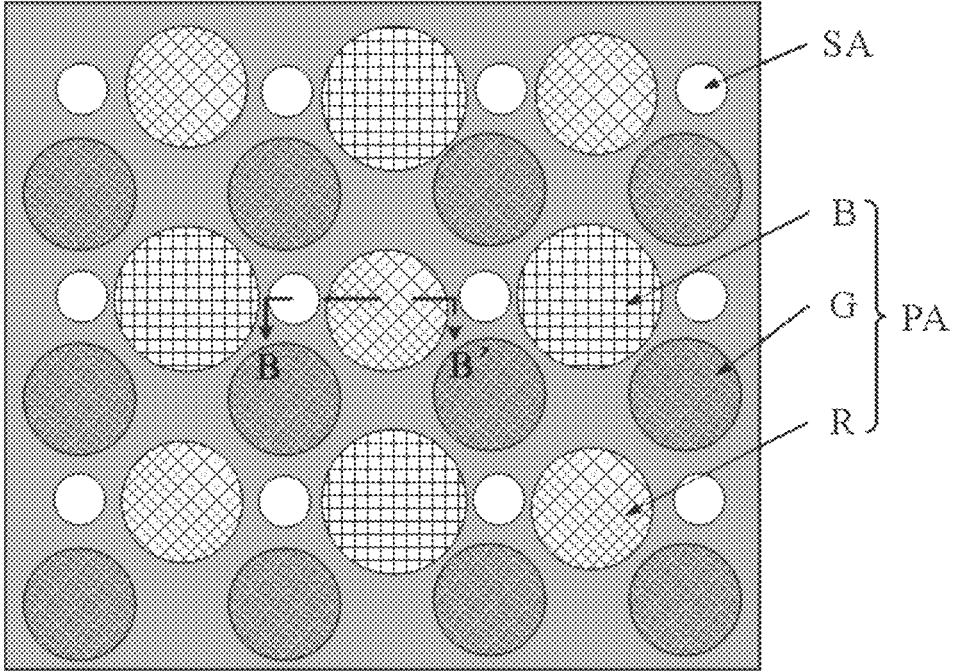
FIG. 2 is an enlarged diagram of an A-A' region of FIG. 1.

Referring to FIG. 1, a display panel includes a display region AA and a border region BA surrounding the display region AA. Referring to FIG. 2, an in-screen optical fingerprint recognition technology refers to a technology for integrating a photosensitive device S into the display region AA so as to reduce a border region BA.

Figure 3:
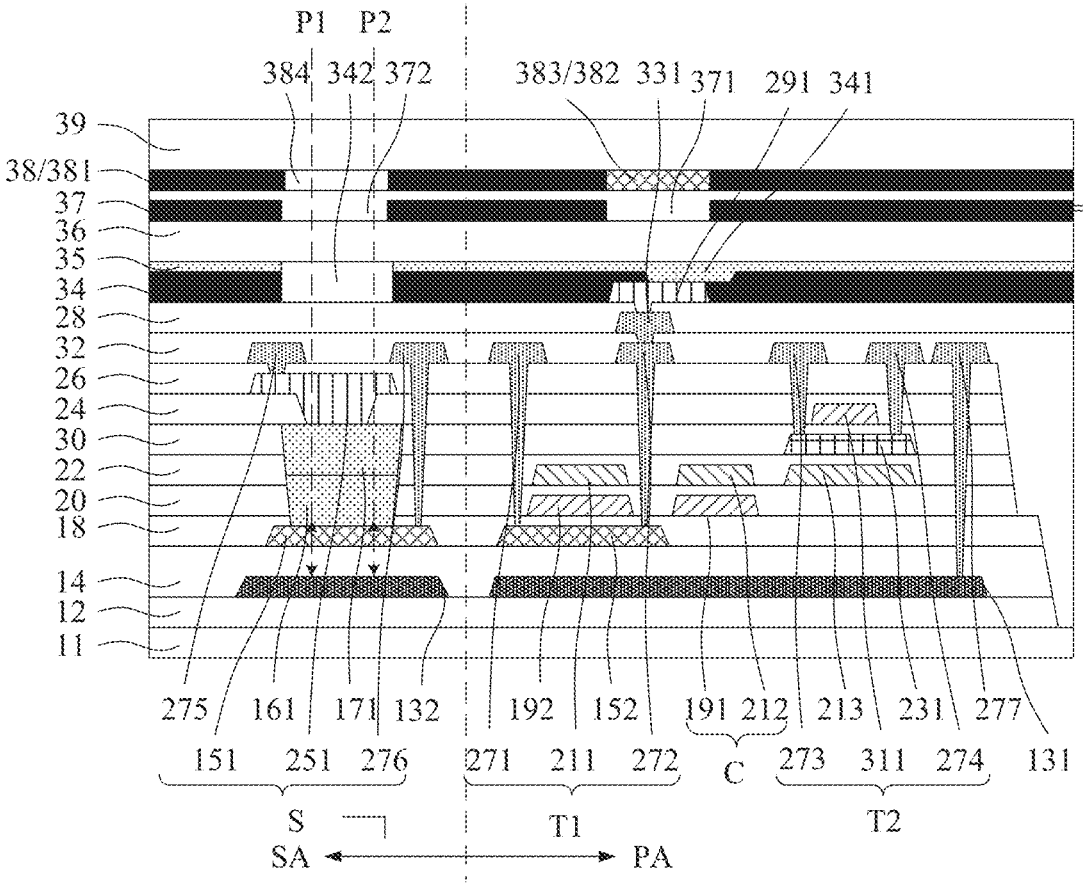
FIG. 3 is a schematic cross-sectional view of the display panel taken along line B-B' in FIG. 2.

Referring to FIGS. 2 and 3, the display panel according to an embodiment of the present application includes a pixel driving circuit provided in a pixel region PA (including a red pixel region R, a green pixel region G, and a blue pixel region B) and a photosensitive device S provided in a photosensitive region SA between the pixel regions PA. The pixel driving circuit includes a first transistor T1, a second transistor T2, and a storage capacitor C.

Specifically, the display panel includes a substrate 11, a first insulation layer 12, a first metal layer, a second insulation layer 14, a first semiconductor layer, a second semiconductor layer, a third semiconductor layer, a third insulation layer 18, a second metal layer, a fourth insulation layer 20, a third metal layer, a fifth insulation layer 22, a fourth semiconductor layer, a sixth insulation layer 24, a fourth metal layer, a seventh insulation layer 26, a fifth metal layer, an eighth insulation layer 28, and a sixth metal layer disposed from bottom to top as shown in FIG. 3. The display panel may further include a ninth insulation layer 30, a seventh metal layer, a tenth insulation layer 32, and an eighth metal layer.

The first metal layer includes a shield portion 131 provided corresponding to the pixel region PA (i.e., in the pixel region PA) and a light-reflection portion 132 provided corresponding to the photosensitive region SA (i.e., in the photosensitive region SA). The first metal layer includes a metal material and/or a non-metal material. For example, the first metal layer includes a metal material, and the metal material is an alloy including one or more of metals such as aluminum (Al), silver (Ag), tungsten (W), copper (Cu), nickel (Ni), chromium (Cr), molybdenum (Mo), titanium (Ti), platinum (Pt), tantalum (Ta), and neodymium (Nd).

The first semiconductor layer includes a first light-transmitting semiconductor portion 151 provided corresponding to the photosensitive region SA and a first driving semiconductor portion 152 provided corresponding to the pixel region PA. Each of the first driving semiconductor portion 152 and the first light-transmitting semiconductor portion 151 includes a polysilicon semiconductor material. Further, each of the first driving semiconductor portion 152 and the first light-transmitting semiconductor portion 151 includes a P-type polysilicon semiconductor material. In practical applications, the first driving semiconductor portion 152 may form a channel region of the first transistor T1 (described later), a source region and a drain region of the first transistor T1 formed on both sides of the channel region. The channel region includes polysilicon without being doped with impurities, that is, an intrinsic semiconductor. The source region and the drain region include polysilicon doped with conductive impurities, that is, an impurity semiconductor. For example, P-type impurities may be doped in the source region and the drain region. The first light-transmitting semiconductor portion 151 may be manufactured in a same layer and by a same process as the source region and the drain region.

The second semiconductor layer includes a photosensitive semiconductor portion 161 provided corresponding to the photosensitive region SA.

The third semiconductor layer includes a second light-transmitting semiconductor portion 171 provided corresponding to the photosensitive region SA. Each of the second light-transmitting semiconductor portion 171 and the photosensitive semiconductor portion 161 includes an amorphous silicon semiconductor material. Further, the second light-transmitting semiconductor portion 171 includes an N-type semiconductor material.

The first light-transmitting semiconductor portion 151, the photosensitive semiconductor portion 161, and the second light-transmitting semiconductor portion 171 are stacked in sequence.

The second metal layer includes a first gate electrode 192 provided corresponding to the first driving semiconductor portion 152 and a first capacitor electrode 191 provided corresponding to the pixel region PA. An orthographic projection of the first gate electrode 192 overlaps that of the first driving semiconductor portion 152.

The third metal layer includes a second capacitor electrode 212 provided corresponding to the first capacitor electrode 191 and a second gate electrode 213 provided corresponding to the pixel region PA. Further, the third metal layer may further include a third gate electrode 211 corresponding to the first gate 192, and the third gate electrode 211 may be connected with the second capacitor electrode 212 to form an integral body.

The fourth semiconductor layer includes a second driving semiconductor portion 231 provided corresponding to the second gate electrode 213. The second driving semiconductor portion 231 includes a metal oxide semiconductor material.

The fourth metal layer includes a transparent electrode 251 provided corresponding to the second light-transmitting semiconductor portion 171. The transparent electrode 251 is connected to the second light-transmitting semiconductor portion 171.

The fifth metal layer includes a first source electrode 271 and a first drain electrode 272 electrically connected to the first driving semiconductor portion 152, a second source electrode 273 and a second drain electrode 274 electrically connected to the second driving semiconductor portion 231, and a first photosensitive electrode 275 and a second photosensitive electrode 276. The first photosensitive electrode 275 is electrically connected to the transparent electrode 251, and the second photosensitive electrode 276 is electrically connected to the first light-transmitting semiconductor portion 151. Further, the fifth metal layer further includes a shield connection electrode 277 electrically connected to the shield portion 131 for shielding the charge on the transistor.

The sixth metal layer includes a first electrode 291 corresponding to the pixel region PA. The first electrode 291 is electrically connected to the first drain 272.

The seventh metal layer includes a fourth gate 311 corresponding to the second driving semiconductor portion 231.

The eighth metal layer includes a lap electrode 331 corresponding to and connecting the first drain electrode 272 and the first electrode 291, respectively.

Thus, the first light-transmitting semiconductor unit 151, the photosensitive semiconductor unit 161, the second light-transmitting semiconductor unit 171, the transparent electrode 251, the first photosensitive electrode 275, and the second photosensitive electrode 276 constitute the photosensitive device S. The first driving semiconductor unit 152, the first gate 192, the third gate electrode 211, the first source electrode 271, and the first drain electrode 272 constitute the first transistor T1. The second gate 212, the second driving semiconductor unit 231, the fourth gate 311, the second source electrode 273, and the second drain electrode 274 constitute the second transistor T2. The first capacitor electrode 191 and the second capacitor electrode 212 constitute a storage capacitor C.

The first light-transmitting semiconductor portion 151 is used as a P-type electrode of the photosensitive device S, so that the structure of the photosensitive device S may be simplified. The source region and the drain region of the first light-transmitting semiconductor portion 151 are formed with the same material by the same process as the source region and the drain region of the first driving semiconductor portion 152, thereby simplifying the manufacturing process of the photosensitive device S and reducing the thickness and the manufacturing cost of the display panel.

Since the first light-transmitting semiconductor portion 151, the photosensitive semiconductor portion 161, and the second light-transmitting semiconductor portion 171 are all of a light-transmitting film structure, there is a problem that light is not absorbed or received by the photosensitive device S after the light passes through the photosensitive device S. According to an embodiment of the present application, a light reflecting section 132 is provided at a side of the photosensitive device S close to the substrate 11, and the light reflected by the finger is reflected to the photosensitive device S by the light reflecting section 132 (as shown in FIG. 3, when the fingerprint recognition light P1 and fingerprint recognition light P2 passing through the photosensitive device S are illuminated to the light reflecting section 132, the light is reflected by the light reflecting section 132 and enters the photosensitive device S again). The amount of the light received (or absorbed) by the photosensitive device S is increased, the optical signal-to-noise ratio of the photosensitive device S is improved, and the sensitivity of in-screen fingerprint recognition is improved.

The front projections of the first light-transmitting semiconductor portion 151, the photosensitive semiconductor portion 161, and the second light-transmitting semiconductor portion 171 on the substrate 11 fall within the front projection of the reflection portion 132 on the substrate 11. In this way, all the light passing through the photosensitive device S may be reflected by the reflection portion 132, thereby maximizing the amount of the light received by the photosensitive device S and improving the optical signal-to-noise ratio of the photosensitive device S.

The reflection portion 132 may have a planar structure as shown in FIG. 3, or may have a curved surface structure as shown in FIGS. 4 to 7. The inner concave surface of the curved surface structure faces the photosensitive device S, so that the fingerprint recognition light P1 and the fingerprint recognition light P2 reflected by the reflection portion 132 converge toward the photosensitive device S, thereby improving the utilization rate of light at an edge, further increasing the amount of the light received by the photosensitive device S, further improving the optical signal-to-noise ratio of the photosensitive device S, and further improving the sensitivity of in-screen fingerprint recognition.

Further, the curved surface structure is symmetrical about a central axis N of the photosensitive device S. In this way, it is ensured that the light converges symmetrically by the curved surface structure, and the light reflected by the curved surface structure may effectively enter the photosensitive device S.

Figure 4:
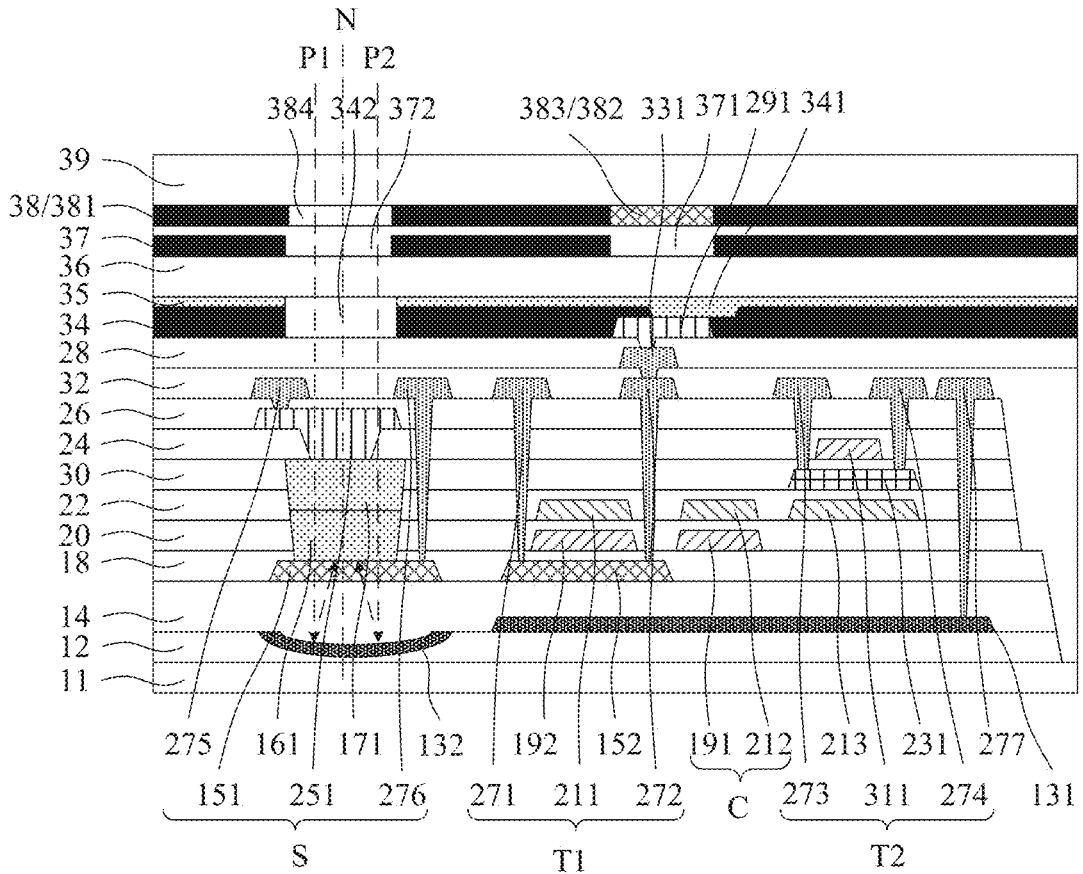
FIG. 4 is a schematic cross-sectional view of the display panel taken along line B-B' in FIG. 2.

In a first embodiment, as shown in FIG. 4, the curved surface structure is a concave arc-shaped structure.

Figure 5:
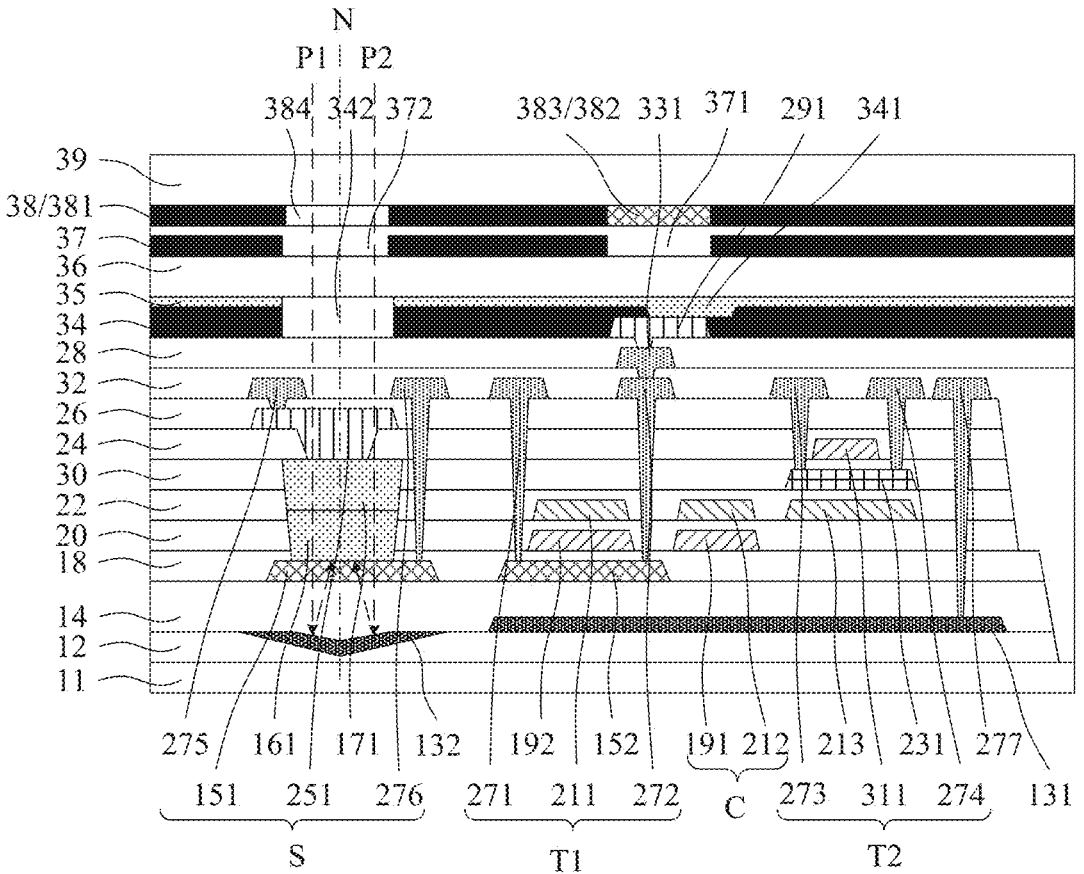
FIG. 5 is a schematic cross-sectional view of the display panel taken along line B-B' in FIG. 2.

In a second embodiment, as shown in FIG. 5, the curved surface structure is a concave V-shaped structure, that is, includes two planar portions inclined with respect to an upper surface of the substrate 11.

Figure 6:
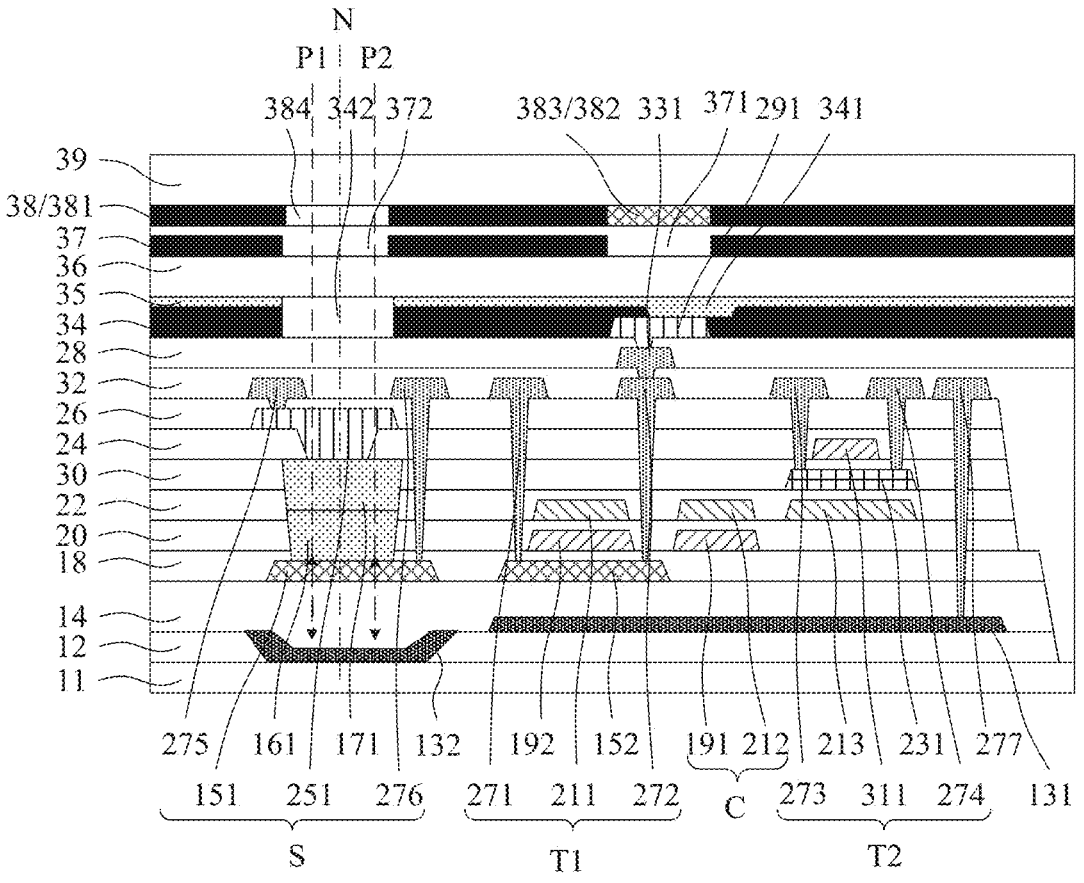
FIG. 6 is a schematic cross-sectional view of the display panel taken along line B-B' in FIG. 2.

In a third embodiment, as shown in FIG. 6, the curved surface structure includes at least two planar portions inclined with respect to the upper surface of the substrate 11 and one planar portion parallel to the upper surface of the substrate 11 and between the at least two planar portions, or includes at least two planar portions inclined with respect to the upper surface of the substrate 11 and one concave curved surface portion therebetween, or includes two concave curved surface portions and one planar structure parallel to the upper surface of the substrate 11 and between the two concave curved surface portions.

Figure 7:
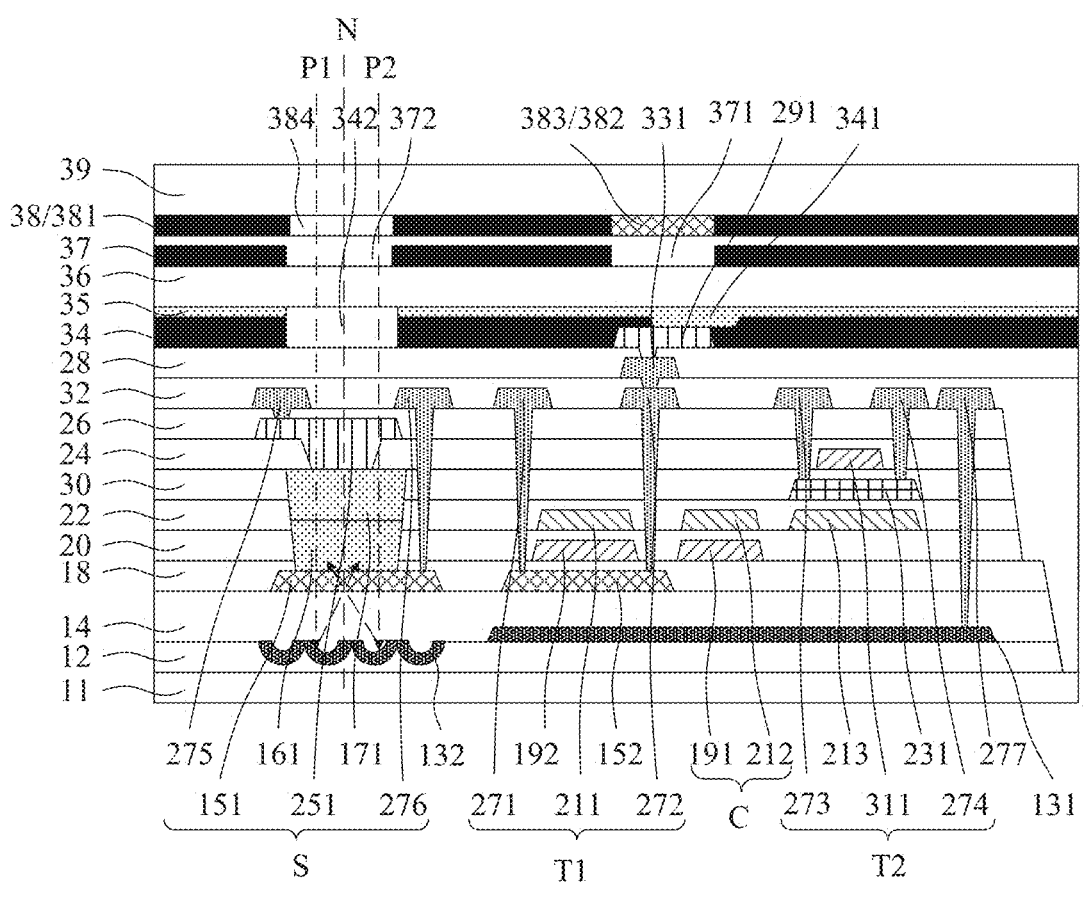
FIG. 7 is a schematic cross-sectional view of the display panel taken along line B-B' in FIG. 2.
Figure 8:
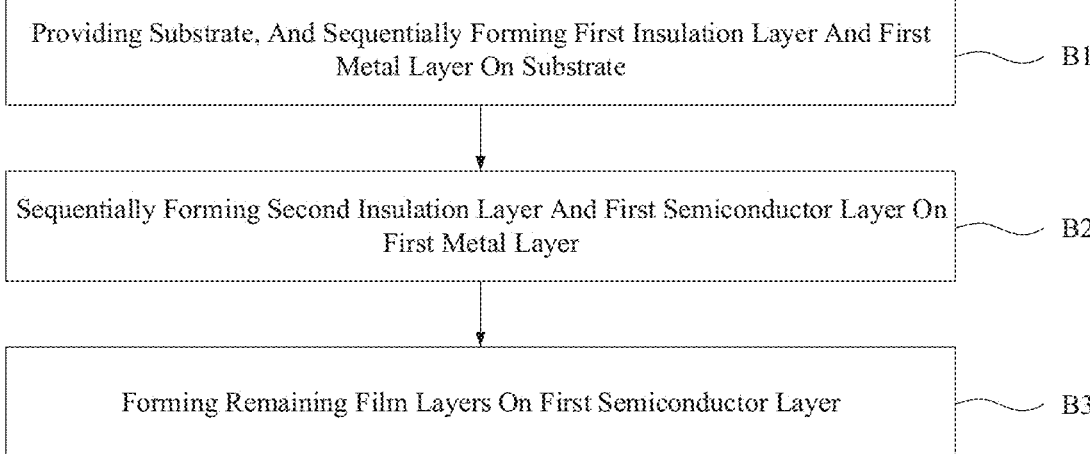
FIG. 8 is a flowchart for manufacturing a display panel according to an embodiment of the present application.

In a fourth embodiment, as shown in FIG. 7, the curved surface structure is formed by a plurality of concave curved surfaces directly connected. In the present embodiment, in the same setting space, by providing the plurality of concave curved surfaces, the reflection angle for the light P1 and P2 may adjusted in a larger range, and may be adjusted and set according to the size of the photosensitive device S.

In other embodiments, the curved surface structure may induce one or more of a plane parallel to the upper surface of the substrate 11, a plane inclined with respect to the upper surface of the substrate 11, and a concave curved surface. That is, the reflection portion 132 according to an embodiment of the present application includes but is not limited to the above four embodiments, so long as the curved surface structure may reflect light P1 and P2 so that the curved surface structure converges toward the photosensitive device S.

The projection of the shield portion 131 on the substrate 11 covers at least that of the second driving semiconductor portion 231, and may further cover that of the first driving semiconductor portion 152. The shield portion 131 is configured to shield the charge on the second transistor T2 while shielding the light incident from the substrate 11 to the second transistor T2, thereby improving the restoration residual image and the service life of the display panel. According to an embodiment of the present application, the reflection portion 132 and the shield portion 131 are provided in the same first metal layer, and the reflection portion 132 and the shield portion 131 are manufactured by the same process, thereby simplifying the process for manufacturing the display panel and avoiding the increase of the thickness and the cost of the display panel.

The display panel includes a plurality of shield portions 131 provided respectively corresponding to the pixel regions, which are electrically connected to each other. The reflection portion 132 may be a suspension (or floated) structure, that is, the reflection portion 132 is provided independently and spaced apart from the shield portions 131, and is not connected with any electric signal. The reflection portion 132 may further be connected to a dynamic electrical signal or a static electrical signal. Further, the reflection portion 132 is electrically connected to the shield portion 131.

In an embodiment, the display panel is an OLED display panel, and the display panel further includes a pixel definition layer 34, a light-emitting material layer 35, an encapsulation layer 36, a touch control layer 37, a color film layer 38, and a cover plate 39 stacked in sequence on the sixth metal layer.

The pixel definition layer 34 includes a pixel opening 341 provided corresponding to the pixel region PA and exposing the first electrode 291 and a first through-hole 342 provided corresponding to the photosensitive device S. The pixel defining layer 34 includes a black color resist material.

The touch control layer 37 includes a pixel through-hole 371 provided corresponding to the pixel opening 341 and a second through-hole 372 provided corresponding to the first through-hole 342.

The color film layer 38 includes a black color resist layer 381 and a filter portion 382. The black color resist layer 381 includes a filter opening 383 provided corresponding to the pixel opening 341 and a third through-hole 384 provided corresponding to the second through-hole 372. The filter portion 382 is provided corresponding to and in the filter opening 383.

The first through-hole 342, the second through-hole 372 and the third through-hole 384 constitute a light collimator located at a light-entering side of the photosensitive device S, thereby avoiding interference between a plurality of fingerprint signals and improving the accuracy of fingerprint recognition.

The display panel according to ab embodiment of the present application includes, but is not limited to, an OLED display panel, an LED display panel, an MLED display panel, or the like.

Figure 9A:
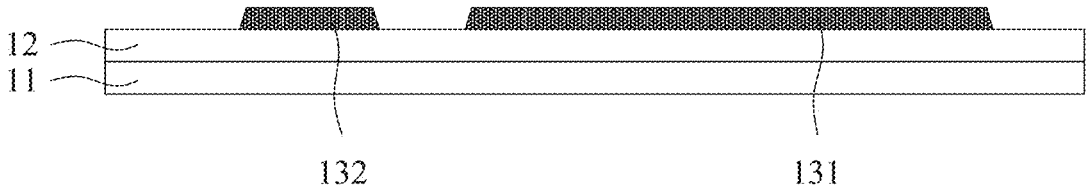
FIGS. 9a to 9c are schematic views showing a display panel in a method of manufacturing the display panel according to an embodiment of the present application.
Figure 9B:
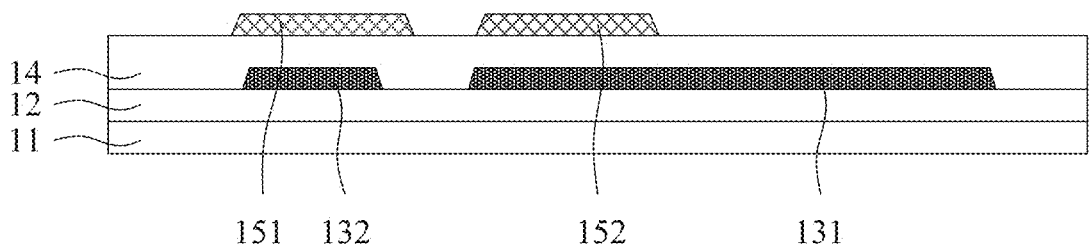
Figure 9C:
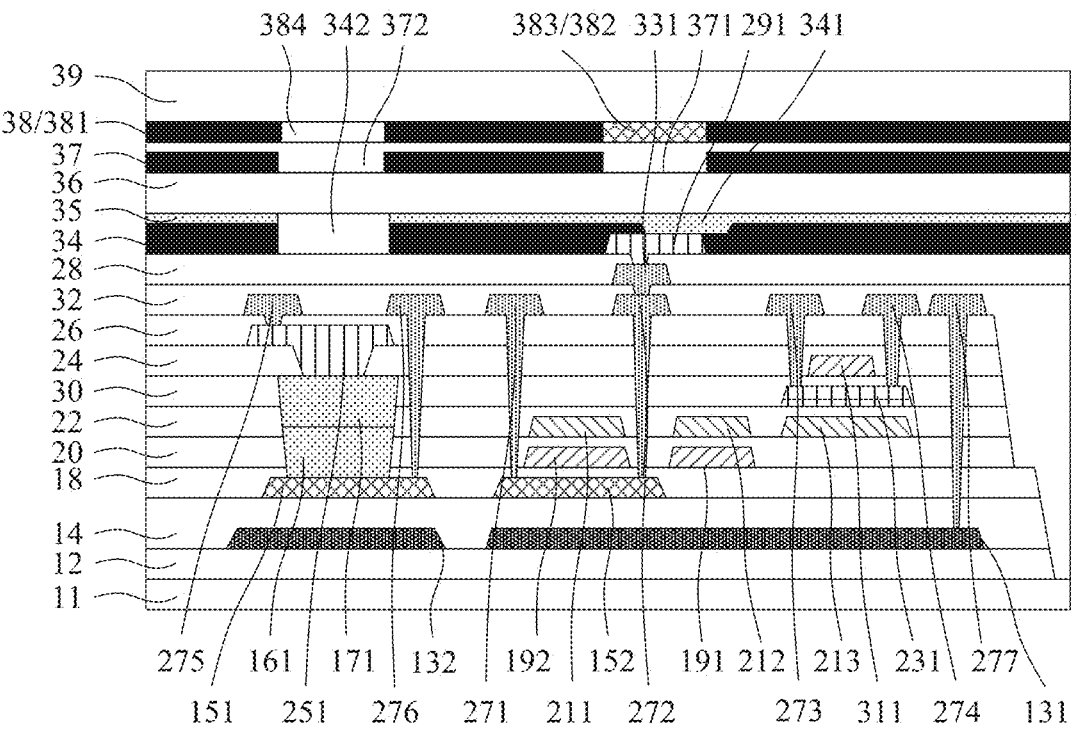

Referring to FIGS. 9a to 9c, an embodiment of the present application further provides a method for manufacturing a display panel. The manufacturing method includes the following steps.

At Step B1, with reference to FIG. 9a, a substrate is provided, and a first insulation layer and a first metal layer are sequentially formed on the substrate. The first metal layer includes a reflection portion and a shield portion.

At Step B2, with reference to FIG. 9b, a second insulation layer and a first semiconductor layer are sequentially formed on the first metal layer. The first semiconductor layer includes a first driving semiconductor portion and a first light-transmitting semiconductor portion.

At Step B3, with reference to FIG. 9c, remaining film layers are formed on the first semiconductor layer.

An embodiment of the present application further provides a display device including the display panel according to any one of the embodiments of the present application.

In summary, an embodiment of the present application provides a display panel and a display device, in which a reflection portion is provided between a photosensitive device and a substrate of the display panel, light passing through the photosensitive device is reflected into the photosensitive device by the reflection portion, so that the amount of the light received by the photosensitive device is increased, the optical signal-to-noise ratio of the photosensitive device is improved, and the sensitivity of in-screen fingerprint recognition is improved.

The display panel and display device according to embodiments of the present application are described in detail above. Specific examples are used herein to illustrate the principles and implementations of the present application. The description of the above embodiments is only used to help understand the method and its core idea of the present application. For those skilled in the art, there will be changes in the specific implementation and application scope according to the idea of the present application. In sum, the presented detailed description is not to be construed as limiting the application.

What is claimed is:

1. A display panel comprising pixel driving circuits provided respectively corresponding to pixel regions and a photosensitive device provided corresponding to a photosensitive region between the pixel regions, wherein the display panel further comprises:

a substrate;

a first metal layer provided on a side of the substrate, wherein the first metal layer comprises a shield portion provided corresponding to the pixel region and a reflection portion provided corresponding to the photosensitive region;

a first semiconductor layer disposed on a side of the first metal layer away from the substrate, wherein the first semiconductor layer comprises a first driving semiconductor portion disposed corresponding to the pixel region and a first light-transmitting semiconductor portion disposed corresponding to the photosensitive region, and the pixel driving circuit comprises the first driving semiconductor portion;

a second semiconductor layer disposed on a side of the first semiconductor layer away from the substrate, wherein the second semiconductor layer comprises a photosensitive semiconductor portion disposed corresponding to the photosensitive region; and a third semiconductor layer disposed on a side of the second semiconductor layer away from the substrate, wherein the third semiconductor layer comprises a second light-transmitting semiconductor portion disposed corresponding to the photosensitive region, and the photosensitive device comprises the first light-transmitting semiconductor portion, the photosensitive semiconductor portion, and the second light-transmitting semiconductor portion stacked in sequence.

2. The display panel according to claim 1, wherein each of the first driving semiconductor portion and the first light-transmitting semiconductor portion comprises a polysilicon semiconductor material.

3. The display panel according to claim 2, wherein each of the first driving semiconductor portion and the first light-transmitting semiconductor portion comprises a P-type polysilicon semiconductor material.

4. The display panel according to claim 3, wherein each of the photosensitive semiconductor portion and the second light-transmitting semiconductor portion comprises an amorphous silicon semiconductor material.

5. The display panel according to claim 4, wherein the second light-transmitting semiconductor portion comprises an N-type semiconductor material.

6. The display panel according to claim 1, wherein each of the pixel driving circuits comprises a first transistor comprising the first driving semiconductor portion, a second transistor, and a storage capacitor, the display panel further comprises:

a second metal layer disposed on a side of the first semiconductor layer away from the substrate, wherein the second metal layer comprises a first capacitor electrode disposed corresponding to the pixel region and a first gate electrode disposed corresponding to the first driving semiconductor portion;

a third metal layer disposed on a side of the second metal layer away from the substrate, wherein the third metal layer comprises a second capacitor electrode disposed corresponding to the first capacitor electrode and a second gate electrode disposed corresponding to the pixel region, and the storage capacitor comprises the first capacitor electrode and the second capacitor electrode;

a fourth semiconductor layer disposed on a side of the third metal layer away from the substrate, wherein the fourth semiconductor layer comprises a second driving semiconductor portion disposed corresponding to the second gate electrode, the second driving semiconductor portion comprises a metal oxide semiconductor material, and the second transistor comprises the second driving semiconductor portion;

a fourth metal layer disposed on a side of the third semiconductor layer away from the substrate, wherein the fourth metal layer comprises a transparent electrode disposed corresponding to the second light-transmitting semiconductor portion; and a fifth metal layer disposed on a side of the fourth semiconductor layer away from the substrate, wherein the fifth metal layer comprises a first source electrode and a first drain electrode electrically connected to the first driving semiconductor portion, a second source electrode and a second drain electrode electrically connected to the second driving semiconductor portion, and a first photosensitive electrode and a second photosensitive electrode, the first photosensitive electrode is electrically connected to the transparent electrode and the second photosensitive electrode is electrically connected to the first light-transmitting semiconductor portion.

7. The display panel according to claim 6, wherein the shield portion is provided corresponding to at least the second transistor;

the shield portion includes a plurality of the shield portions provided respectively corresponding to pixel regions; and the plurality of the shield portions are electrically connected to each other, and the reflection portion is provided spaced apart from the shield portions.

8. The display panel according to claim 6, wherein the shield portion is provided corresponding to at least the second transistor;

the shield portion includes a plurality of the shield portions provided respectively corresponding to pixel regions; and the plurality of the shield portions are electrically connected to each other, and the reflection portion is electrically connected to the shield portions.

9. The display panel according to claim 1, further comprising: a pixel definition layer provided on a side of the third semiconductor layer away from the substrate, wherein the pixel definition layer comprises a pixel opening provided corresponding to the pixel region and a first through-hole provided corresponding to the photosensitive region, and the pixel definition layer comprises a black color resistance material.

10. The display panel according to claim 9, further comprising:

a touch control layer disposed on a side of the pixel definition layer away from the substrate, wherein the touch control layer comprises a pixel through-hole disposed corresponding to the pixel region and a second through-hole disposed corresponding to the photosensitive region; and a color film layer provided on a side of the touch control layer away from the substrate, wherein the color film layer comprises a black color resist layer and a filter portion, the black color resist layer comprises a filter opening provided corresponding to the pixel region and a third through-hole provided corresponding to the photosensitive region, and the filter portion is provided corresponding to the filter opening.

11. A display device comprising a display panel, wherein the display panel comprising pixel driving circuits provided respectively corresponding to pixel regions and a photosensitive device provided corresponding to a photosensitive region between the pixel regions, and wherein the display panel further comprises:

a substrate;

a first metal layer provided on a side of the substrate, wherein the first metal layer comprises a shield portion provided corresponding to the pixel region and a reflection portion provided corresponding to the photosensitive region;

a first semiconductor layer disposed on a side of the first metal layer away from the substrate, wherein the first semiconductor layer comprises a first driving semiconductor portion disposed corresponding to the pixel region and a first light-transmitting semiconductor portion disposed corresponding to the photosensitive region, and the pixel driving circuit comprises the first driving semiconductor portion;

a second semiconductor layer disposed on a side of the first semiconductor layer away from the substrate, wherein the second semiconductor layer comprises a photosensitive semiconductor portion disposed corresponding to the photosensitive region; and a third semiconductor layer disposed on a side of the second semiconductor layer away from the substrate, wherein the third semiconductor layer comprises a second light-transmitting semiconductor portion disposed corresponding to the photosensitive region, and the photosensitive device comprises the first light-transmitting semiconductor portion, the photosensitive semiconductor portion, and the second light-transmitting semiconductor portion stacked in sequence.

12. The display device according to claim 11, wherein each of the first driving semiconductor portion and the first light-transmitting semiconductor portion comprises a polysilicon semiconductor material.

13. The display device according to claim 12, wherein each of the first driving semiconductor portion and the first light-transmitting semiconductor portion comprises a P-type polysilicon semiconductor material.

14. The display device according to claim 13, wherein each of the photosensitive semiconductor portion and the second light-transmitting semiconductor portion comprises an amorphous silicon semiconductor material.

15. The display device according to claim 14, wherein the second light-transmitting semiconductor portion comprises an N-type semiconductor material.

16. The display device according to claim 11, wherein each of the pixel driving circuits comprises a first transistor comprising the first driving semiconductor portion, a second transistor, and a storage capacitor, the display panel further comprises:

a second metal layer disposed on a side of the first semiconductor layer away from the substrate, wherein the second metal layer comprises a first capacitor electrode disposed corresponding to the pixel region and a first gate electrode disposed corresponding to the first driving semiconductor portion;

a third metal layer disposed on a side of the second metal layer away from the substrate, wherein the third metal layer comprises a second capacitor electrode disposed corresponding to the first capacitor electrode and a second gate electrode disposed corresponding to the pixel region, and the storage capacitor comprises the first capacitor electrode and the second capacitor electrode;

a fourth semiconductor layer disposed on a side of the third metal layer away from the substrate, wherein the fourth semiconductor layer comprises a second driving semiconductor portion disposed corresponding to the second gate electrode, the second driving semiconductor portion comprises a metal oxide semiconductor material, and the second transistor comprises the second driving semiconductor portion;

a fourth metal layer disposed on a side of the third semiconductor layer away from the substrate, wherein the fourth metal layer comprises a transparent electrode disposed corresponding to the second light-transmitting semiconductor portion; and a fifth metal layer disposed on a side of the fourth semiconductor layer away from the substrate, wherein the fifth metal layer comprises a first source electrode and a first drain electrode electrically connected to the first driving semiconductor portion, a second source electrode and a second drain electrode electrically connected to the second driving semiconductor portion, and a first photosensitive electrode and a second photosensitive electrode, the first photosensitive electrode is electrically connected to the transparent electrode and the second photosensitive electrode is electrically connected to the first light-transmitting semiconductor portion.

17. The display device according to claim 16, wherein the shield portion is provided corresponding to at least the second transistor;

the shield portion includes a plurality of the shield portions provided respectively corresponding to pixel regions; and the plurality of the shield portions are electrically connected to each other, and the reflection portion is provided spaced apart from the shield portions.

18. The display device according to claim 16, wherein the shield portion is provided corresponding to at least the second transistor;

the shield portion includes a plurality of the shield portions provided respectively corresponding to pixel regions; and the plurality of the shield portions are electrically connected to each other, and the reflection portion is electrically connected to the shield portions.

19. The display device according to claim 11, further comprising: a pixel definition layer provided on a side of the third semiconductor layer away from the substrate, wherein the pixel definition layer comprises a pixel opening provided corresponding to the pixel region and a first through-hole provided corresponding to the photosensitive region, and the pixel definition layer comprises a black color resistance material.

20. The display device according to claim 19, further comprising:

a touch control layer disposed on a side of the pixel definition layer away from the substrate, wherein the touch control layer comprises a pixel through-hole disposed corresponding to the pixel region and a second through-hole disposed corresponding to the photosensitive region; and a color film layer provided on a side of the touch control 5 layer away from the substrate, wherein the color film layer comprises a black color resist layer and a filter portion, the black color resist layer comprises a filter opening provided corresponding to the pixel region and a third through-hole provided corresponding to the 10 photosensitive region, and the filter portion is provided corresponding to the filter opening.

\* \* \* \* \*